United States Patent
Burr et al.

(10) Patent No.: US 8,415,730 B2
(45) Date of Patent: *Apr. 9, 2013

(54) SELECTIVE COUPLING OF VOLTAGE FEEDS FOR BODY BIAS VOLTAGE IN AN INTEGRATED CIRCUIT DEVICE

(76) Inventors: James B Burr, Foster City, CA (US); Robert Fu, Cupertino, CA (US)

(*) Notice: Subject to any disclaimer, the term of this patent is extended or adjusted under 35 U.S.C. 154(b) by 1419 days.

This patent is subject to a terminal disclaimer.

(21) Appl. No.: 12/033,840

(22) Filed: Feb. 19, 2008

(65) Prior Publication Data

US 2008/0135905 A1    Jun. 12, 2008

Related U.S. Application Data

(63) Continuation of application No. 10/765,316, filed on Jan. 26, 2004, now Pat. No. 7,332,763, which is a continuation-in-part of application No. 10/334,272, filed on Dec. 31, 2002, now Pat. No. 6,936,898.

(51) Int. Cl.
*G11C 5/14* (2006.01)

(52) U.S. Cl. ............... 257/299; 257/E23.079; 327/530; 365/185.27

(58) Field of Classification Search ............ 365/189.09; 257/E29.064, E27.067; 327/530, 534
See application file for complete search history.

(56) References Cited

U.S. PATENT DOCUMENTS

| | | | |
|---|---|---|---|
| 4,605,980 A | 8/1986 | Hartranft et al. | |
| 4,907,058 A | 3/1990 | Sakai | |
| 5,160,816 A | 11/1992 | Chlop | |
| 5,355,008 A | 10/1994 | Moyer et al. | |
| 5,447,876 A | 9/1995 | Moyer et al. | |
| 5,552,333 A | 9/1996 | Cheung et al. | |
| 5,636,129 A | 6/1997 | Her | |
| 5,726,477 A | 3/1998 | Williams et al. | |
| 5,781,034 A | 7/1998 | Rees et al. | |
| 5,895,940 A | 4/1999 | Kim | |
| 5,913,122 A | 6/1999 | Lee et al. | |
| 6,048,746 A | 4/2000 | Burr | |
| 6,087,892 A | 7/2000 | Burr | |
| 6,091,283 A | 7/2000 | Murgula et al. | |
| 6,169,310 B1 | 1/2001 | Kalnitsky et al. | |
| 6,180,998 B1 | 1/2001 | Crafts | |
| 6,194,776 B1 | 2/2001 | Amano et al. | |
| 6,218,708 B1 | 4/2001 | Burr | |
| 6,218,895 B1 | 4/2001 | De et al. | |
| 6,260,179 B1 | 7/2001 | Ohsawa et al. | |
| 6,303,444 B1 | 10/2001 | Burr | |

(Continued)

FOREIGN PATENT DOCUMENTS

EP    0624909 A2    11/1994
JP    10199993    7/1998

*Primary Examiner* — Lynne Gurley
*Assistant Examiner* — Vernon P Webb (57) ABSTRACT

An integrated circuit device having a body bias voltage mechanism. The integrated circuit comprises a resistive structure disposed therein for selectively coupling either an external body bias voltage or a power supply voltage to biasing wells. A first pad for coupling with a first externally disposed pin can optionally be provided. The first pad is for receiving an externally applied body bias voltage. Circuitry for producing a body bias voltage can be coupled to the first pad for coupling a body bias voltage to a plurality of biasing wells disposed on the integrated circuit device. If an externally applied body bias voltage is not provided, the resistive structure automatically couples a power supply voltage to the biasing wells. The power supply voltage may be obtained internally to the integrated circuit.

19 Claims, 8 Drawing Sheets

U.S. PATENT DOCUMENTS

| | | |
|---|---|---|
| 6,405,358 B1 | 6/2002 | Nuber |
| 6,412,102 B1 | 6/2002 | Andreev et al. |
| 6,489,224 B1 | 12/2002 | Burr |
| 6,498,592 B1 | 12/2002 | Matthies |
| 6,536,028 B1 | 3/2003 | Katsioulas et al. |
| 6,570,810 B2 | 5/2003 | Wong |
| 6,617,656 B2 | 9/2003 | Lee et al. |
| 6,677,643 B2 | 1/2004 | Iwamoto et al. |
| 6,724,044 B2 | 4/2004 | Blanchard |
| 6,772,859 B2 | 8/2004 | D'Antonio et al. |
| 6,777,978 B2 | 8/2004 | Hart et al. |
| 6,813,756 B2 | 11/2004 | Igarashi et al. |
| 6,892,375 B2 | 5/2005 | Kimura |
| 6,936,898 B2 | 8/2005 | Pelham et al. |
| 7,003,748 B1 | 2/2006 | Hsu |
| 7,012,461 B1 * | 3/2006 | Chen et al. .................. 327/535 |
| 7,049,699 B1 | 5/2006 | Masleid et al. |
| 7,098,512 B1 | 8/2006 | Pelham et al. |
| 7,211,478 B1 | 5/2007 | Pelham et al. |
| 7,388,260 B1 | 6/2008 | Masleid et al. |
| 2001/0024859 A1 | 9/2001 | Takahashi et al. |
| 2001/0028577 A1 | 10/2001 | Sung et al. |
| 2002/0040985 A1 | 4/2002 | Aldrich |
| 2003/0121017 A1 | 6/2003 | Andreev et al. |
| 2003/0237064 A1 | 12/2003 | White et al. |
| 2004/0019870 A1 | 1/2004 | Ohmori |
| 2004/0085099 A1 | 5/2004 | Ratchkov et al. |
| 2004/0124475 A1 | 7/2004 | Pelham et al. |
| 2004/0128631 A1 | 7/2004 | Ditzel et al. |
| 2004/0128636 A1 | 7/2004 | Ishikura |
| 2004/0178493 A1 | 9/2004 | Correale, Jr. |
| 2004/0216074 A1 | 10/2004 | Hart et al. |
| 2005/0127428 A1 | 6/2005 | Mokhlesi et al. |
| 2006/0026551 A1 | 2/2006 | Shrowty et al. |
| 2006/0102958 A1 | 5/2006 | Masleid |
| 2006/0277520 A1 | 12/2006 | Gennari |
| 2006/0282798 A1 | 12/2006 | Beattie et al. |
| 2007/0038430 A1 | 2/2007 | Walker et al. |

* cited by examiner

SELECTIVE COUPLING OF VOLTAGE FEEDS FOR BODY BIAS VOLTAGE IN AN INTEGRATED CIRCUIT DEVICE

RELATED APPLICATIONS

This is a Continuation Application of, and claims benefit to, U.S. patent application Ser. No. 10/765,316, now U.S. Pat. No. 7,332,763, filed Jan. 26, 2004, to Burr and Fu, which is hereby incorporated herein by reference in its entirety, which is a Continuation-in-Part of commonly-owned U.S. patent application Ser. No. 10/334,272 filed Dec. 31, 2002, now U.S. Pat. No. 6,936,898, entitled "Diagonal Deep Well Region for Routing Body-Bias Voltage for MOSFETs in Surface Well Regions" to Pelham and Burr, which is hereby incorporated herein by reference in its entirety.

U.S. Pat. No. 6,489,224, entitled "Method for Engineering the Threshold Voltage of a Device Using Buried Wells", to J. Burr, issued Dec. 3, 2002, is hereby incorporated herein by reference in its entirety.

U.S. Pat. No. 6,303,444, entitled "Method for Introducing an Equivalent RC Circuit in a MOS Device Using Resistive Wells", to J. Burr, issued Oct. 16, 2001, is hereby incorporated herein by reference in its entirety.

U.S. Pat. No. 6,218,708, entitled "Back-Biased MOS Device and Method", to J. Burr, issued Apr. 17, 2001, is hereby incorporated herein by reference in its entirety.

U.S. Pat. No. 6,091,283, entitled "Sub-Threshold Leakage Tuning Circuit", issued Jul. 18, 2000, is hereby incorporated herein by reference in its entirety.

U.S. Pat. No. 6,087,892, entitled "Target Ion/Ioff Threshold Tuning Circuit and Method", to J. Burr, issued Jul. 11, 2000, is hereby incorporated herein by reference in its entirety.

U.S. Pat. No. 6,048,746, entitled "Method for Making Die-Compensated Threshold Tuning Circuit", to J. Burr, issued Apr. 11, 2000, is hereby incorporated herein by reference in its entirety.

FIELD OF THE INVENTION

Embodiments of the present invention relate to the manufacture and operation of integrated circuits. More particularly, embodiments of the present invention relate to selectively coupling voltage feeds to body bias voltage in an integrated circuit device.

BACKGROUND

The generation of the physical layout of a semiconductor device having MOSFETs (metal oxide semiconductor field effect transistors) formed on a semiconductor substrate is a challenging task. An extensive amount of time and resources are spent during the creation of the physical layout. However, the effort can be reduced if new physical layouts utilize substantial portions of existing physical layouts. For example, a new physical layout comprising body-biased MOSFETs would consume fewer resources if an existing physical layout comprising MOSFETs without body biasing is utilized and modified according to the needs of the new physical design. Unfortunately, this process of modifying the existing physical layout typically requires forming one or more additional routing layer(s) for the body biasing voltage(s) on the surface of the semiconductor device, creating a serious issue as the existing physical layout typically utilizes most if not all, of the available surface area. Additionally, it is highly desirable to accommodate the use of such a modified semiconductor device in applications designed for the unmodified (prior) semiconductor device. Consequently, it would be advantageous to provide a mechanism to vary the body voltage applied within such an integrated circuit.

SUMMARY OF THE INVENTION

An integrated circuit device having a body bias voltage mechanism is disclosed. The integrated circuit comprises a resistive structure disposed therein for selectively coupling either an external body bias voltage or a power supply voltage to biasing wells. A first pad for coupling with a first externally disposed pin can optionally be provided. The first pad is for receiving an externally applied body bias voltage. Circuitry for producing a body bias voltage can be coupled to the first pad for coupling a body bias voltage to a plurality of biasing wells disposed on the integrated circuit device. If an externally applied body bias voltage is not provided, the resistive structure automatically couples a power supply voltage to the biasing wells. The power supply voltage may be obtained internally to the integrated circuit.

In accordance with other embodiments of the present invention, a semiconductor device is disclosed. A first terminal for coupling a voltage to a body terminal of a metal oxide semiconductor is provided. In this embodiment, the body terminal is not coupled to a source or a drain of the metal oxide semiconductor.

More specifically, in accordance with still other embodiments of the present invention, a semiconductor device is provided, including a metal voltage rail coupled to a supply voltage. A first region of n well diffusion is provided substantially below and coupled to the metal voltage rail. A second region of n well diffusion is coupled to a plurality of n well diffusion lines, wherein the n well diffusion lines couple a voltage of the second region of n well diffusion to n well regions of semiconductor devices. The first region of n well diffusion forms a desired resistance between the metal voltage rail and the second region of n well diffusion.

DETAILED DESCRIPTION OF THE INVENTION

In the following detailed description of the present invention, selective coupling of voltage feeds for body bias voltage in an integrated circuit device, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Selective Coupling of Voltage Feeds for Body Bias Voltage in an Integrated Circuit Device Embodiments of the present invention are described in the context of design and operation of highly integrated semiconductor devices. It is appreciated, however, that elements of the present invention may be utilized in other areas of semiconductor operation.

Although the following description of embodiments of the present invention will focus on coupling a body-bias voltage to pFETs (or p-type MOSFETS) formed in surface N-wells via a conductive sub-surface region of N-type doping when a p-type substrate and an N-well process are utilized, embodiments in accordance with the present invention are equally applicable to coupling a body-bias voltage to nFETs (or n-type MOSFETS) formed in surface P-wells via a conductive sub-surface region of P-type doping when an n-type substrate and a P-well process are utilized.

Figure 1:
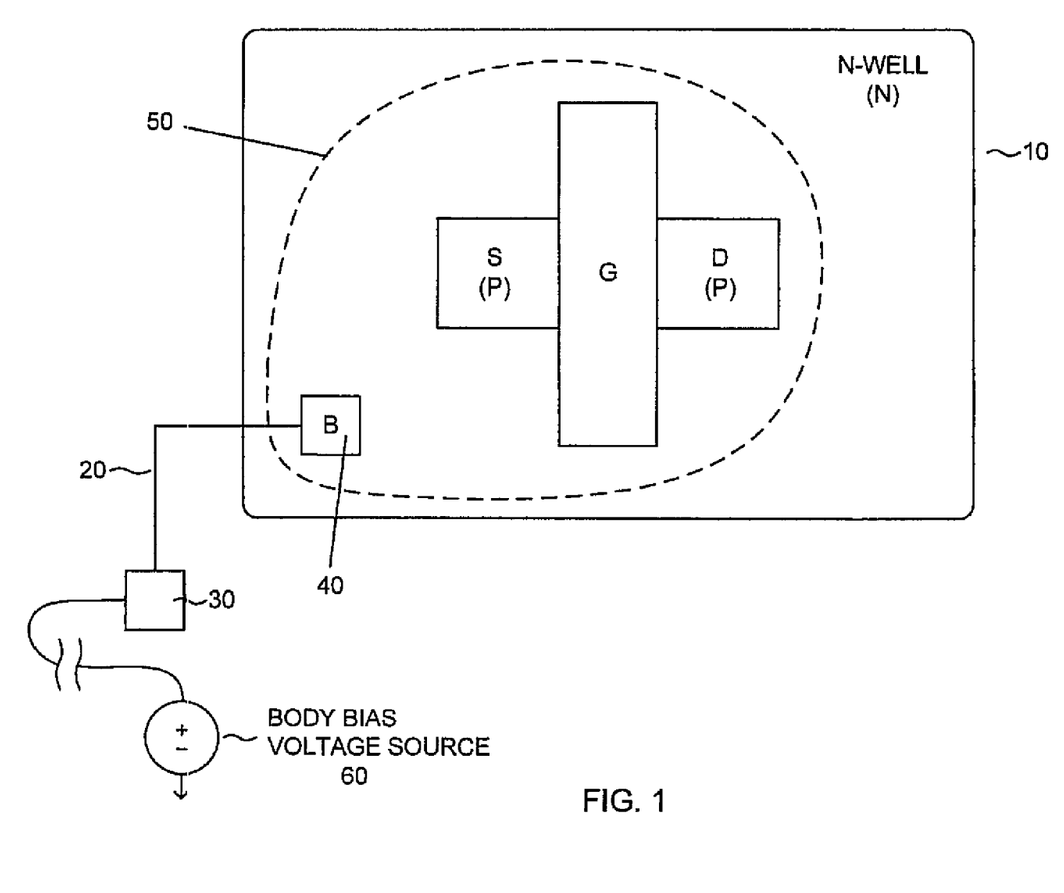
FIG. 1 illustrates a top view of a pFET (or p-type MOSFET), in accordance with embodiments of the present invention.

FIG. 1 illustrates a top view of a pFET 50 (or p-type MOSFET) formed in an N-well 10 when a p-type substrate and an N-well process are utilized in accordance with an embodiment of the present invention. As depicted in FIG. 1, pFET 50 comprises gate G, drain D (p-type doping), source S (p-type doping), and bulk/body B terminal 40. In particular, the bulk/body B terminal 40 is coupled to the N-well 10. Hence, a voltage applied to the bulk/body B terminal is received by the N-well 10. The N-well has an n-type doping. Regions of a semiconductor device that are doped with an n-type dopant have one type of conductivity while regions that are doped with a p-type dopant have another type of conductivity. Typically, various dopant concentrations are utilized in different regions of the semiconductor device.

It is to be appreciated that bulk/body B terminal 40 is coupled to terminal 30 via coupling 20. Coupling 20 conducts a signal, typically a substantially DC voltage generated, e.g., by body bias voltage source 60, from terminal 30 to bulk/body B terminal 40. Body bias voltage source 60 may be an on-chip voltage source or provided externally to an integrated circuit device.

Utilizing coupling 20, pFET 50 may be body-biased to influence its performance. More specifically, a bias voltage may be applied via coupling 20 to bulk/body B terminal 40. Without a body-biasing structure, the source S and bulk/body B terminal 40 are typically coupled together. With a body-biasing structure as described herein, the source S and bulk/body B terminals are not coupled together. Body biasing enables controlling a potential difference between the source S and bulk/body B terminals of the pFET 50, providing the ability to electrically tune the threshold voltage level of the pFET 50.

In accordance with embodiments of the present invention, terminal 30 may comprise a wide variety of well known structures. For example, terminal 30 may comprise an external package pin of a device comprising pFET 50. As an external pin, a voltage may be selectively coupled to the pin at an advantageous stage in a product development cycle, e.g., at final assembly by a jumper on a printed wiring board. By producing a semiconductor with a capability to provide a body bias voltage in this manner, users of the semiconductor device may take advantage of the benefits of body biasing while enjoying the ability to optimize the actual voltage later in the design process. It is appreciated that terminal 30 may be coupled to the same voltage rail as the source, yielding a MOS configuration similar to conventional devices lacking body biasing capabilities.

In the case of body biasing, the bulk/body B terminal receives a body-bias voltage Vn-well. As described above, the bulk/body B terminal represents a connection to the N-well 10. Thus, the body-bias voltage Vn-well is applied to the N-well 10.

Figure 2A:
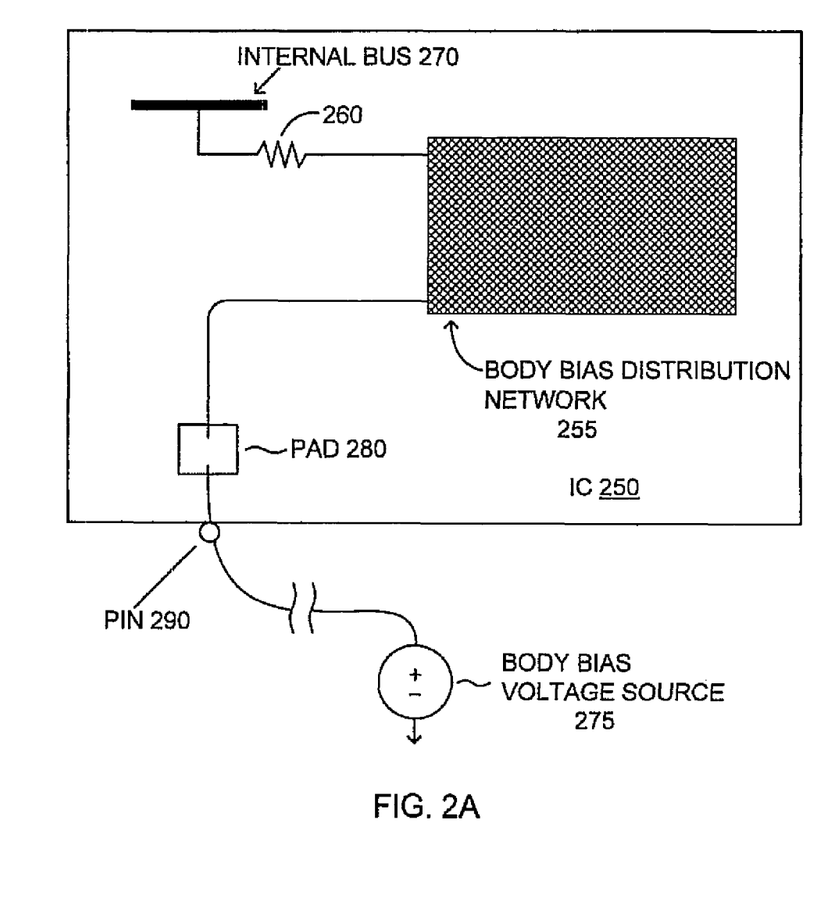
FIG. 2A illustrates an integrated circuit device in accordance with embodiments of the present invention.

FIG. 2A illustrates an integrated circuit device 250 in accordance with embodiments of the present invention. Integrated circuit device 250 comprises a body bias distribution network 255. Body bias distribution network 255 distributes a bias voltage to body terminals, e.g., body terminal 40 of FIG. 1, of semiconductor devices within integrated circuit device 250.

In accordance with embodiments of the present invention, a body bias voltage distributed by body bias distribution network 255 may be accessed from body bias voltage source 275, typically located off chip. An external body bias voltage source would typically be coupled via pin 290 to pad 280 to body bias distribution network 255.

In a case in which body bias voltage source 275 is not provided, or in a case in which body bias voltage source 275 suffers a failure, it is desirable for body bias wells to be maintained at a known voltage. An undefined voltage on a body bias well can result in unpredictable effects upon a threshold voltage of associated transistor devices, possibly leading to erroneous operation, increased leakage current, latch up and/or damage to such transistor devices.

Accordingly, body bias distribution network 255 is also coupled to an internal voltage bus 270, e.g., a power supply voltage (Vdd) distribution bus. In a case in which body bias voltage source 275 is unavailable, the body bias wells are held at approximately the voltage of internal voltage bus 270, e.g., Vdd. In order to avoid a low resistance coupling, e.g., a "short," between body bias voltage source 275 and internal bus 270, which are typically at different voltages, the coupling between body bias distribution network 25 and internal bus 270 is made through a resistive structure 260. In general, resistive structure 260 should have a high resistance value compared to the path resistance of body bias distribution network 250.

Figure 2B:
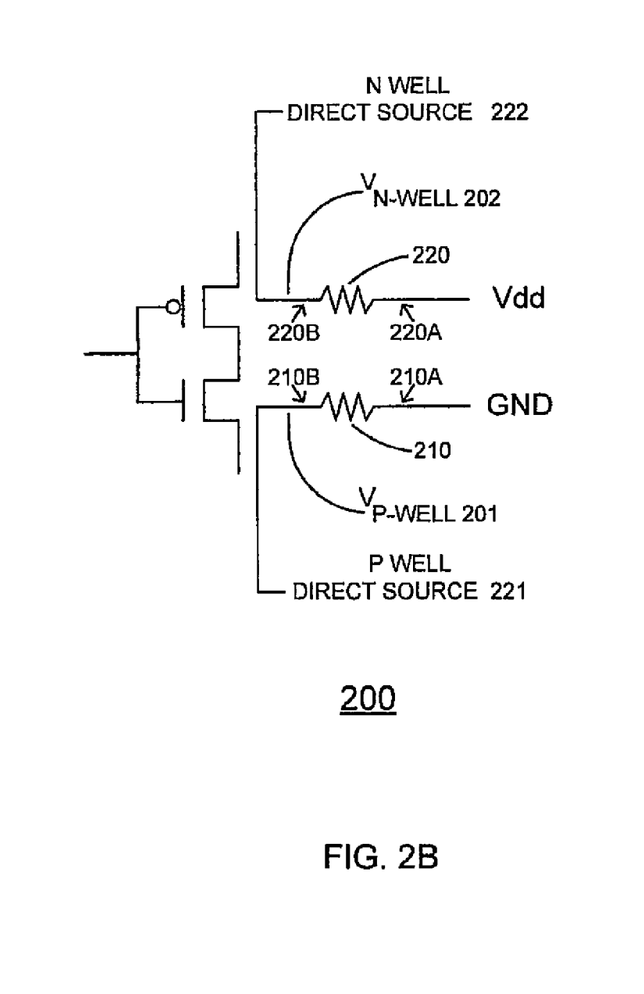
FIG. 2B illustrates a schematic of coupling between wells and power rails, in accordance with embodiments of the present invention.

FIG. 2B illustrates a schematic 200 of a device for coupling between wells and power rails, in accordance with embodiments of the present invention. Voltage Vn-well 202 is a voltage applied to n wells of a semiconductor as described previously. Similarly, voltage Vp-well 201 is a voltage applied to p wells of a semiconductor. In general, to take advantage of decreased threshold voltage benefits of biased junctions, voltage Vn-well 202 should be greater than the supply voltage, Vdd, operating the semiconductor device. Frequently, such voltage is provided directly, for example via N well direct source 222, which can be, e.g., an on-chip voltage source or external package pins coupled to an external voltage source. It is to be appreciated that embodiments in accordance with the present invention are well suited to forward biasing, e.g., Vn-well 202 less than the supply voltage, Vdd.

If a body bias voltage Vn-well 202 is not provided, e.g., by an on-chip voltage source or external package pin(s) coupled to an external voltage source, the body wells should not be left at an undefined voltage, e.g., "floating." An undefined voltage on a body bias well can result in unpredictable effects upon a threshold voltage of associated transistor devices, possibly leading to erroneous operation, increased leakage current, latch up and/or damage to such transistor devices.

In accordance with embodiments of the present invention, in such an absence of a defining voltage supply, body bias voltage Vn-well 202 can be biased to approximately the power supply by coupling N well structures to Vdd (or another suitable voltage) via resistive structure 220. A typical current in a deep n well body bias voltage distribution network can be about 1 µA. A typical resistance value for resistive structure 220 is approximately 1 kilo ohm in accordance with one implementation.

Similarly, voltage Vp-well 201 should be less than the low voltage, typically ground, coupled to the "ground" terminals of the semiconductor device to achieve a decreased threshold voltage. Frequently, such voltage is provided directly, for example via P well direct source 221, which can be, e.g., an on-chip ground connection or external package pins coupled to an external voltage source or ground. It is to be appreciated that embodiments in accordance with the present invention are well suited to forward biasing, e.g., Vp-well 201 greater than ground.

Similarly, if a body bias voltage Vp-well 201 is not provided, e.g., by an on-chip voltage source or external package pin(s) coupled to an external voltage source, the body wells should not be left at an undefined voltage, e.g., "floating." An undefined voltage on a body bias well can result in unpredictable effects upon a threshold voltage of the associated transistor devices, possibly leading to erroneous operation, increased leakage current, latch up and/or damage to such transistor devices.

In accordance with embodiments of the present invention, in such an absence of a defining voltage supply, body bias voltage Vp-well 201 can be biased to approximately the power supply low voltage, typically ground, by coupling P well structures to ground (or another suitable voltage) via resistive structure 210. A typical current in a deep n well body bias voltage distribution network can be about 1 µA. A typical resistance value for resistive structure 210 is approximately 1 kilo ohm in one embodiment.

As is explained in U.S. patent application Ser. No. 10/334,272, referenced above, it is highly desirable to add body-biasing well structures to an existing chip design with minimum modification to the integrated circuit. Similarly, it would be highly desirable to add elements of coupling 200 to an existing chip design with minimum modification to the integrated circuit.

It is to be appreciated that coupling 200 provides an advantageous migration path for upgrading semiconductors from "non-body-biased" to a body-biased configuration, while minimizing impact to users of such products. For example, a circuit board can be designed for a first, "non-body biased" chip. By using elements of coupling 200, a second chip with biased N and P wells can be used in the same circuit board without modification to the circuit board. Resistive structures 201 and 202 can be used to couple existing voltage rails to the biasing wells, enabling the second chip to operate in a controlled manner.

Alternatively, additional pins, e.g., pins unused on the first chip, can be used to enable a new well-biasing function. For example, when the second chip (with biasing wells) is installed into a circuit board, N well direct source 222 could be coupled to a bias voltage supply, e.g., external to the chip, while resistive structure 220 provides isolation between the Vdd and bias voltage supplies. Resistive structure 210 can provide similar isolation between a low bias voltage supply and ground.

Figure 3A:
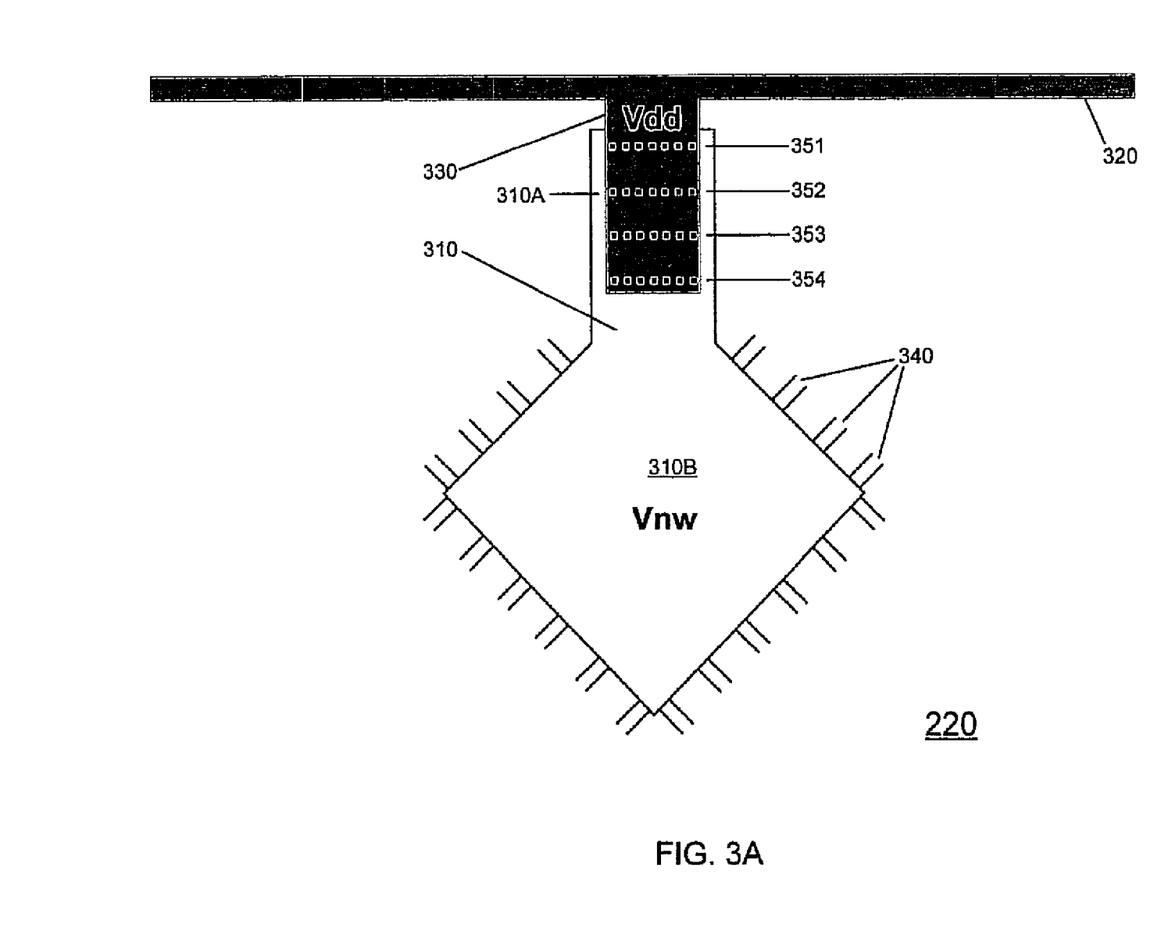
FIG. 3A illustrates an exemplary resistive structure, in accordance with embodiments of the present invention.

FIG. 3A illustrates a plan view of an exemplary resistive structure 220, in accordance with embodiments of the present invention. Resistive structure 220 is formed utilizing metallization, contacts, N+ diffusion, an N well and a deep N well structure. Resistive structure 220 can be formed in an area of a chip having an N well region with no devices located in the N well region.

Resistive structure 220 comprises metallization 320 coupled to a power voltage, e.g., Vdd. Metallization 320 corresponds schematically to terminal 220A of FIG. 2. Deep N well 310 generally comprises a region of N well diffusion. Diffusion region 310A is substantially below metallization 330. Metallization 330 is coupled to metallization 320. By well known engineering techniques, the size, shape and separation of metallization 330 and diffusion region 310A can be designed to achieve a desired resistance, for example 1 kilo ohm. It is to be appreciated that substantially all of the resistance is achieved by diffusion region 310A. Diffusion region 310A can be designed with, for example, a length to width ratio of two to one. Such a regular shape allows for computationally straightforward design of resistance values. It is appreciated, however, that embodiments in accordance with the present invention are well suited to a wide variety of shapes for diffusion region 210A.

Metallization 330 is coupled to diffusion region 310A by a plurality of contacts, e.g., contacts 351. Generally, only one set of contacts 351-354 will actually be used. By including provision for multiple sets of contacts in the design, the resistance of structure 220 can be determined empirically, and adjusted. For example, if only contacts 351 are constructed and used, the resistive path will have a higher resistance than if contacts 354 are utilized.

Diffusion region 310B is coupled to diffusion region 310A. Coupled to diffusion region 310B is a plurality of diffusion "lines" 340. Diffusion lines 340 couple resistive structure 220 to the various N well diffusion regions of the active devices of the semiconductor. It is to be appreciated that diffusion lines 340 are not coupled directly to diffusion region 310A. In this manner, diffusion region 310B corresponds schematically to terminal 220B of FIG. 2. Diffusion region 310B is designed with a size and shape so as to allow coupling to diffusion lines 340 with a desirably low resistance.

Figure 3B:
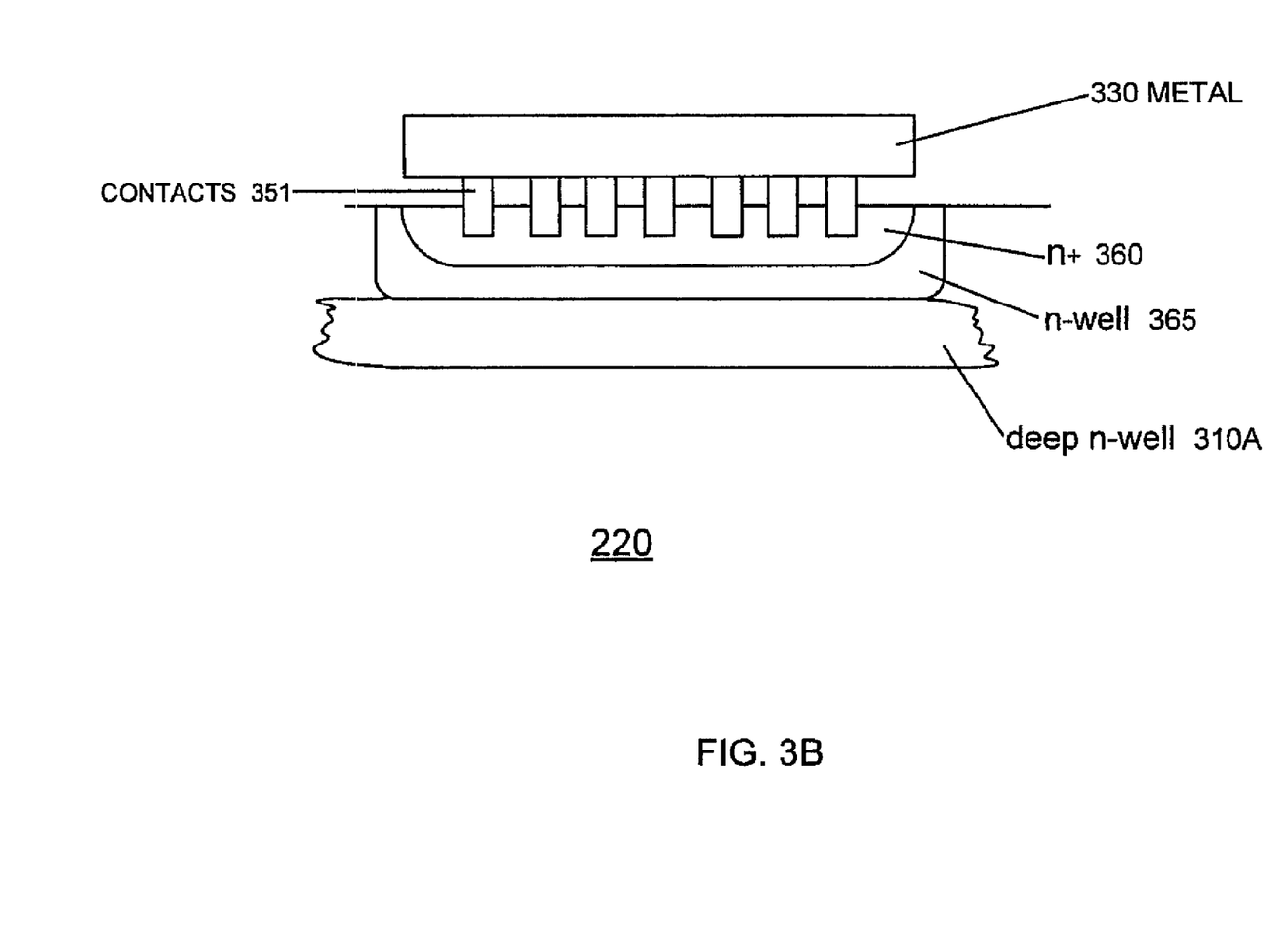
FIG. 3B illustrates a cross-sectional view of an exemplary resistive structure, in accordance with embodiments of the present invention.

FIG. 3B illustrates a cross-sectional view of an exemplary resistive structure 220, in accordance with embodiments of the present invention. FIG. 3B illustrates a section through contacts 351.

As conventional contacts typically do not couple to wells, metallization 330 is coupled via contacts 351 to N+ diffusion region 360. N+ diffusion region 360 is coupled to n-well 365. N-well 365 serves as a low resistance coupling to deep n-well 310A.

It is appreciated that FIGS. 3A and 3B illustrate embodiments in accordance with the present invention practiced in an n well semiconductor. More specifically, a resistive structure is formed between Vdd and lines 340 comprising a measured size of either n well or deep n well embedded in a p substrate. Embodiments in accordance with the present invention are well suited to practice in p well semiconductors. For example, a similar resistive structure can be formed embedded in an n substrate using a measured size of either p well or deep p well.

Figure 4A:
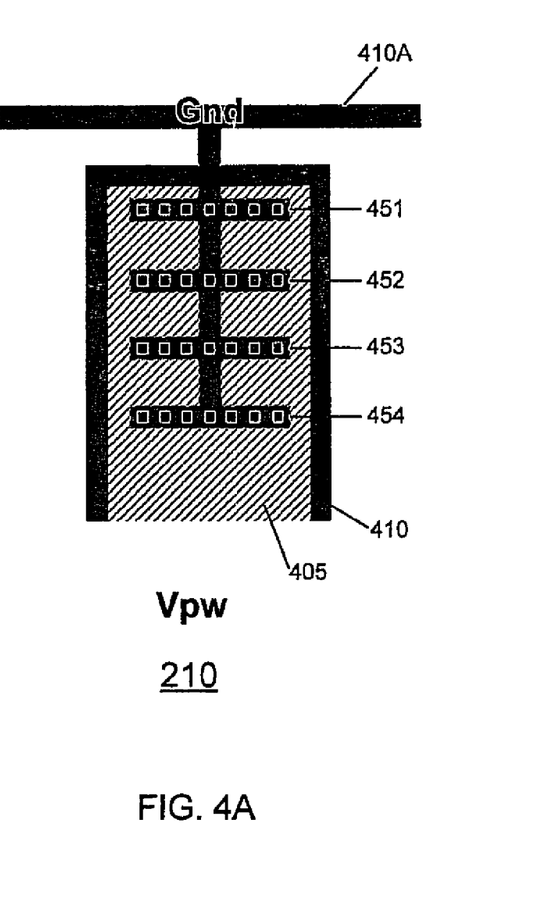
FIG. 4A illustrates an exemplary resistive structure, in accordance with embodiments of the present invention.

FIG. 4A illustrates a plan view of an exemplary resistive structure 210, in accordance with embodiments of the present invention. Resistive structure 210 is formed utilizing a contact layer and a deep N well structure. Metallization 410A is coupled to a low voltage power rail, e.g., ground. Metallization 410A corresponds schematically to terminal 210A of FIG. 2. N well diffusion region 410A is constructed around P well diffusion region 405. In this manner P well diffusion region 405 is isolated from the substrate except for the portion at the bottom of the figure. The portion of P well region 405 at the bottom of the figure corresponds schematically to terminal 210B of FIG. 2B.

Metallization 410A is coupled to P well region 405 by a plurality of contacts, e.g., contacts 451. Generally, only one set of contacts 451-454 will actually be used. By including provision for multiple sets of contacts in the design, the resistance of structure 210 can be determined empirically, and adjusted. For example, if only contacts 451 are constructed and used, the resistive path will have a higher resistance than if contacts 454 are utilized.

In accordance with well known engineering techniques, the size, shape and separation of metallization 410A and P well region 405 can be designed to achieve a desired resistance, for example 1 kilo ohm. P well region 405 can be designed with, for example, a length to width ratio of two to one. Such a regular shape allows for computationally straightforward design of resistance values. It is appreciated, however, that embodiments in accordance with the present invention are well suited to a wide variety of shapes for P well region 405. It is to be appreciated that substantially all of the resistance is achieved by P well region 405. The portion of P well region 405 at the bottom of the figure corresponds schematically to terminal 210B of FIG. 2B.

Figure 4B:
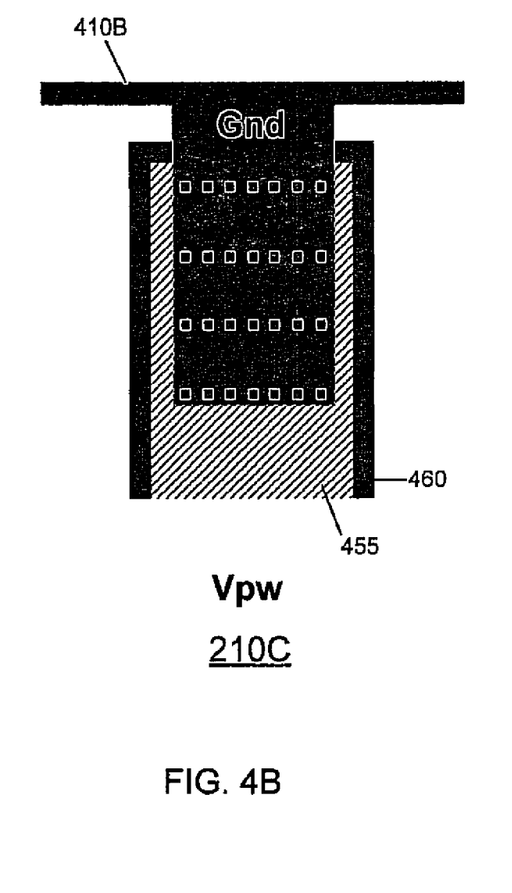
FIG. 4B illustrates an alternative resistive structure, in accordance with embodiments of the present invention.

FIG. 4B illustrates an alternative resistive structure 210C, in accordance with embodiments of the present invention. Resistive structure 210C is formed utilizing a contact layer and a deep N well structure. Metallization 410B is coupled to a low voltage power rail, e.g., ground. Metallization 410B corresponds schematically to terminal 210A of FIG. 2. N well diffusion region 460 is constructed around deep N well diffusion region 455. In this manner P well diffusion region 455 is isolated from the substrate except for the portion at the bottom of the FIG. 4B.

According to well known engineering techniques, the size, shape and separation of metallization 410B and P well region 455 can be designed to achieve a desired resistance, for example 1 kilo ohm. It is to be appreciated that substantially all of the resistance is achieved by P well region 455.

Figure 4C:
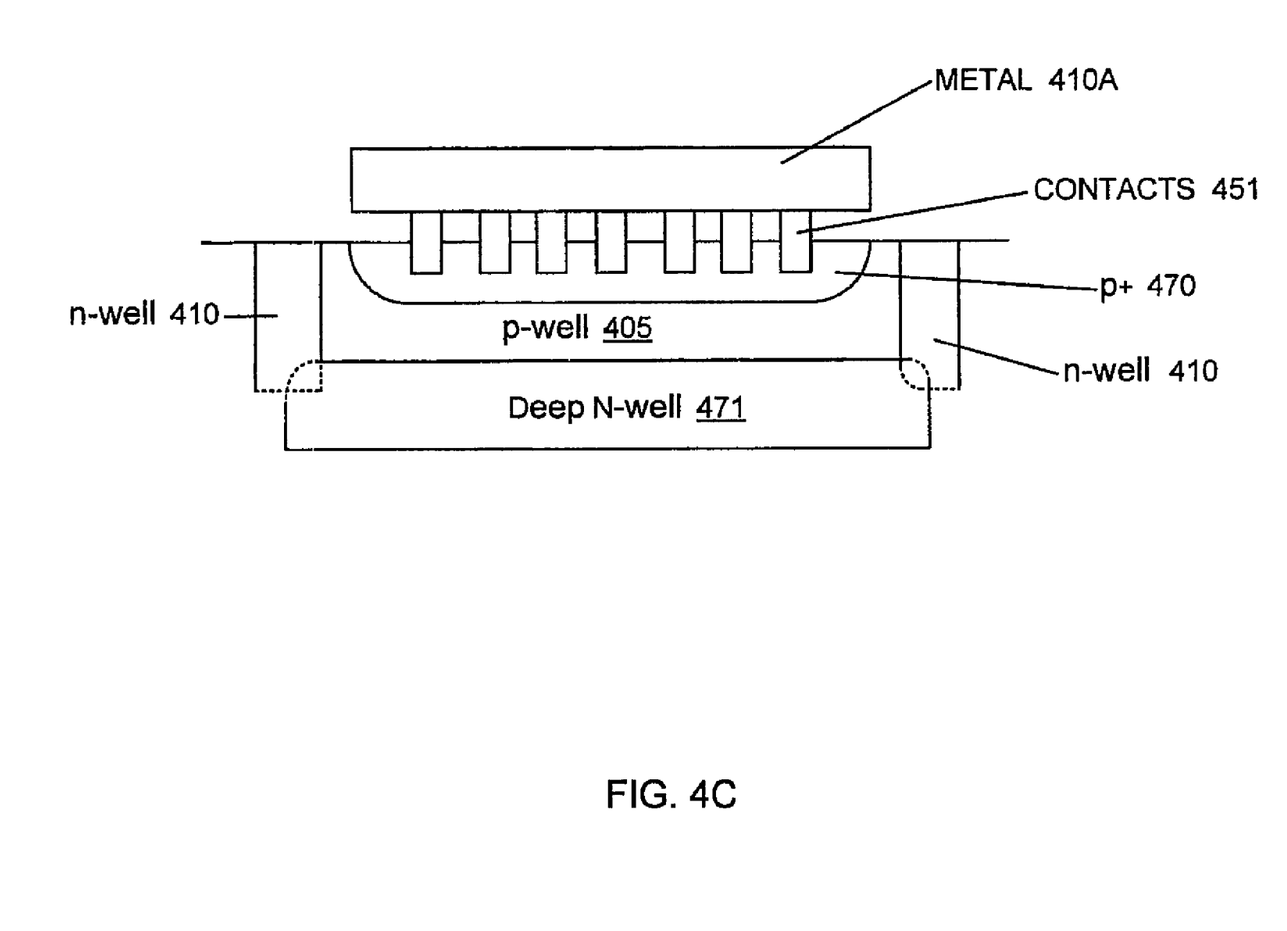
FIG. 4C illustrates a cross-sectional view of an exemplary resistive structure, in accordance with embodiments of the present invention.

FIG. 4C illustrates a cross-sectional view of exemplary resistive structure 210, in accordance with embodiments of the present invention. FIG. 4C illustrates a section through contacts 451.

As conventional contacts typically do not couple to wells, metallization 410A is coupled via contacts 451 to P+ diffusion region 470. P+ diffusion region 470 couples to p-well 405. N-well 410 and deep n-well 471 form a three-sided "box" around p well 405, forcing current to flow through the "bottom" of p-well 405 as shown in plan view in FIG. 4A. P-well region 405 is isolated from the p-type substrate by n-well 410 and deep n-well 471. As p-well region 405 has a high resistance, forcing current to flow along the length of p-well 405 achieves a desired resistance. It is to be appreciated that a cross section through a row of contacts for resistive structure 210C (FIG. 4B) can be substantially similar.

It is appreciated that FIGS. 4A, 4B and 4C illustrate embodiments in accordance with the present invention practiced in an n well semiconductor. More specifically, a resistive structure is formed between Vss (ground) and a p substrate comprising a measured size of isolated conduit of either n well or deep n well embedded in the p substrate. Embodiments in accordance with the present invention are well suited to practice in p well semiconductors. For example, a similar resistive structure can be formed embedded in an n substrate using a measured size of isolated conduit of either p well or deep p well embedded in the n substrate.

Figure 5:
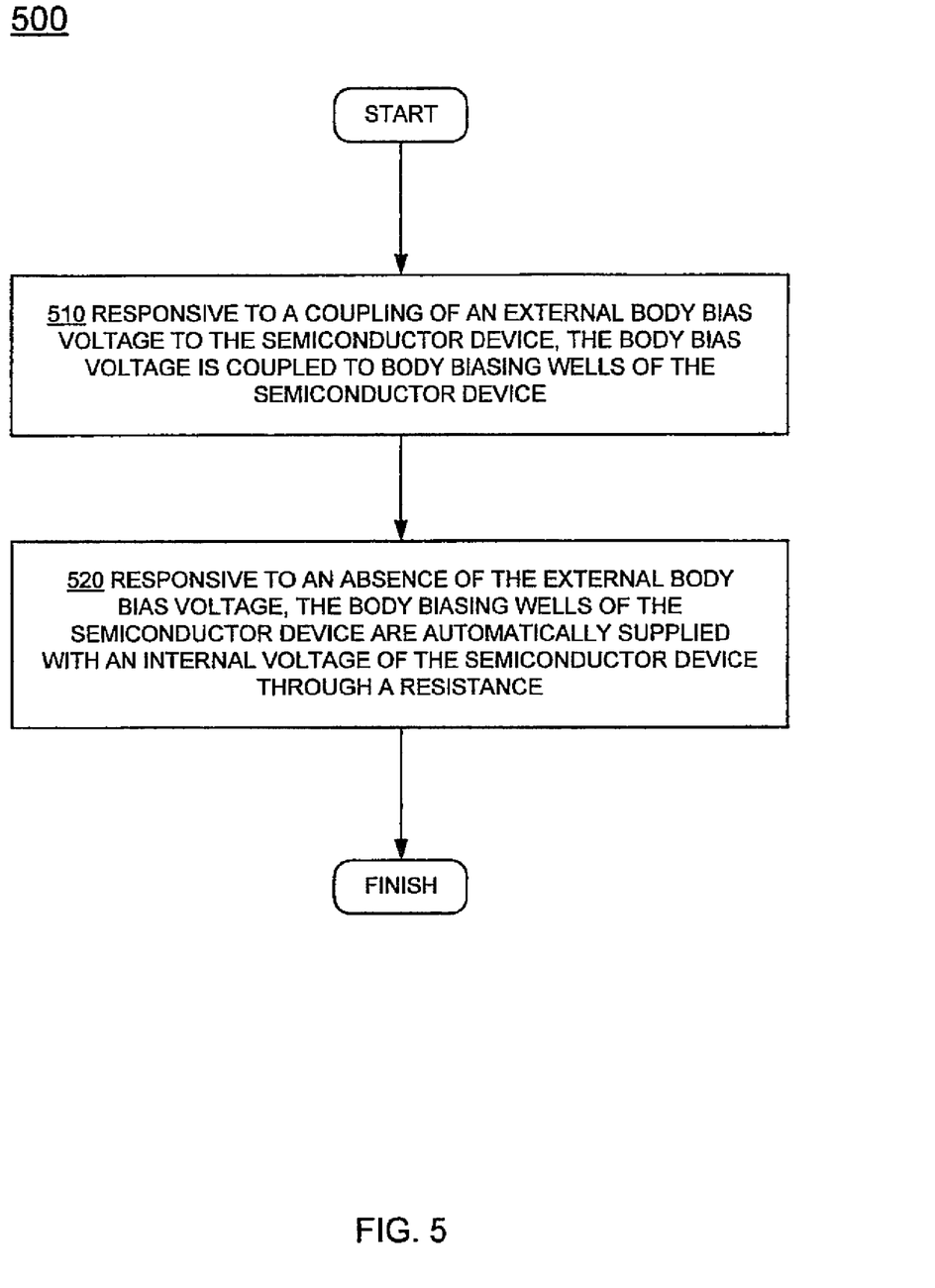
FIG. 5 illustrates a flow chart of a method for providing a body bias voltage in a semiconductor device, in accordance with embodiments of the present invention.

FIG. 5 illustrates a flow chart for a method 500 of providing a body bias voltage in a semiconductor device having a selectable coupling device, in accordance with embodiments of the present invention. In block 510, responsive to a coupling of an external body bias voltage to a designated pin of the semiconductor device, the external body bias voltage is coupled to body biasing wells of the semiconductor device.

In block 520, provided the external body bias voltage is not present, the body biasing wells of the semiconductor device are automatically supplied with an internal voltage of the semiconductor device through a resistance, e.g., resistive structure 220 of FIG. 2B to provide the body bias voltage. In this novel manner, a semiconductor, e.g., a microprocessor comprising body-biasing wells, can advantageously be operated with or without an external body-biasing voltage applied. If an external body-biasing voltage is applied, the body bias can advantageously adjust a threshold voltage of transistor devices, e.g., to reduce leakage current. If no external body-biasing voltage is applied, the wells can be coupled to a power supply voltage, e.g., Vdd, such that the wells are at a fixed potential. In general, the coupling to a power supply voltage should be of sufficiently low resistance that the body biasing wells have a negligible effect on threshold voltages.

Embodiments in accordance with the present invention provide a circuit mechanism to selectively couple an external a voltage to body-biasing wells of a semiconductor device. Further embodiments of the present invention provide for the above mentioned solution to be achieved with existing semiconductor processes and equipment without revamping well established tools and techniques.

Embodiments in accordance with the present invention, selective coupling of voltage feeds for body bias voltage in an integrated circuit device, are thus described. While the present invention has been described in particular embodiments, it should be appreciated that the present invention should not be construed as limited by such embodiments, but rather construed according to the below claims.

What is claimed is:

1. An integrated circuit comprising:
a body bias distribution circuit operable to receive an externally applied voltage;
an internal voltage bus; and
a circuit component operable to couple said internal voltage bus to said distribution circuit absent said externally applied voltage.

2. An integrated circuit as described in claim 1 wherein said externally applied voltage is substantially applied to said distribution circuit when said externally applied voltage is applied.

3. An integrated circuit as described in claim 2 wherein said circuit component is a resistor element.

4. An integrated circuit as described in claim 2 further comprising an external pin coupled to said pad, said external pin for coupling with said externally supplied voltage.

5. An integrated circuit as described in claim 2 wherein said internal voltage bus is coupled to a power supply voltage of said integrated circuit.

6. An integrated circuit as described in claim 1 further comprising a plurality of metal oxide semiconductor transistors coupled to said body bias distribution circuit.

7. An integrated circuit as described in claim 6 wherein said plurality of metal oxide semiconductor transistors are coupled to said distribution circuit via respective body terminals.

8. An integrated circuit comprising:

a body bias distribution circuit operable to receive an externally applied voltage;

an internal voltage bus; and a circuit component operable to isolate said internal voltage bus from said distribution circuit responsive to said externally applied voltage, wherein said externally applied voltage is substantially applied to said distribution circuit when said externally applied voltage is applied.

9. An integrated circuit as described in claim 8 wherein said circuit component is a resistor element.

10. An integrated circuit as described in claim 8 further comprising an external pin coupled to said pad, said external pin for coupling with said externally supplied voltage.

11. An integrated circuit as described in claim 8 wherein said internal voltage bus is coupled to a power supply voltage of said integrated circuit.

12. An integrated circuit as described in claim 8 further comprising a plurality of metal oxide semiconductor transistors coupled to said body bias distribution circuit.

13. An integrated circuit as described in claim 12 wherein said plurality of metal oxide semiconductor transistors are coupled to said distribution circuit via respective body terminals.

14. The integrated circuit of claim 8 wherein said circuit component comprises an n well region.

15. The integrated circuit of claim 14 wherein said circuit component forms a desired resistance between said internal voltage and said n well region.

16. A method of providing a body bias voltage in a semiconductor device comprising:

responsive to a coupling of an external body bias voltage to said semiconductor device, coupling said body bias voltage to body biasing wells of said semiconductor device.

17. The method of claim 16 further comprising:

responsive to an absence of said external body bias voltage, automatically supplying said body biasing wells of said semiconductor device with an internal voltage of said semiconductor device.

18. The method of claim 16 wherein said internal voltage is a power supply voltage for said semiconductor device.

19. The method of claim 16 wherein said internal voltage is a ground reference for said semiconductor device.

* * * * *

UNITED STATES PATENT AND TRADEMARK OFFICE
CERTIFICATE OF CORRECTION

PATENT NO.         : 8,415,730 B2
APPLICATION NO.    : 12/033840
DATED              : April 9, 2013
INVENTOR(S)        : Burr et al.

It is certified that error appears in the above-identified patent and that said Letters Patent is hereby corrected as shown below:

On the Title Page, in Column 1, Line 4, delete item "(76)" and insert -- (75) --, therefor.

On the Title Page, item (76), under "Inventors", in Column 1, Line 1,
delete "B" and insert -- B. --, therefor.

In the Specifications

In Column 3, Line 10, delete "MOSFETS)" and insert -- MOSFETs) --, therefor.

In Column 3, Line 25, delete "MOSFETS)" and insert -- MOSFETs) --, therefor.

In Column 4, Line 42, delete "distribution network 25" and
insert -- distribution network 255 --, therefor.

In Column 4, Lines 45-46, delete "distribution network 250." and
insert -- distribution network 255. --, therefor.

In Column 6, Line 10, delete "2." and insert -- 2B. --, therefor.

In Column 6, Line 24, delete "diffusion region 210A." and insert -- diffusion region 310A. --, therefor.

In Column 6, Line 40, delete "2." and insert -- 2B. --, therefor.

In Column 7, Line 1, delete "2." and insert -- 2B. --, therefor.

In Column 7, Line 33, delete "2." and insert -- 2B. --, therefor.

In the Claims

Signed and Sealed this
Seventeenth Day of September, 2013

Teresa Stanek Rea
*Deputy Director of the United States Patent and Trademark Office*

CERTIFICATE OF CORRECTION (continued)
U.S. Pat. No. 8,415,730 B2

In Column 8, Line 49, in Claim 2, delete "An integrated" and insert -- The integrated --, therefor.

In Column 8, Line 53, in Claim 3, delete "An integrated" and insert -- The integrated --, therefor.

In Column 8, Line 55, in Claim 4, delete "An integrated" and insert -- The integrated --, therefor.

In Column 8, Line 58, in Claim 5, delete "An integrated" and insert -- The integrated --, therefor.

In Column 8, Line 61, in Claim 6, delete "An integrated" and insert -- The integrated --, therefor.

In Column 8, Line 64, in Claim 7, delete "An integrated" and insert -- The integrated --, therefor.

In Column 9, Line 12, in Claim 9, delete "An integrated" and insert -- The integrated --, therefor.

In Column 9, Line 14, in Claim 10, delete "An integrated" and insert -- The integrated --, therefor.

In Column 9, Line 18, in Claim 11, delete "An integrated" and insert -- The integrated --, therefor.

In Column 9, Line 21, in Claim 12, delete "An integrated" and insert -- The integrated --, therefor.

In Column 10, Line 1, in Claim 13, delete "An integrated" and insert -- The integrated --, therefor.